Figure 1:
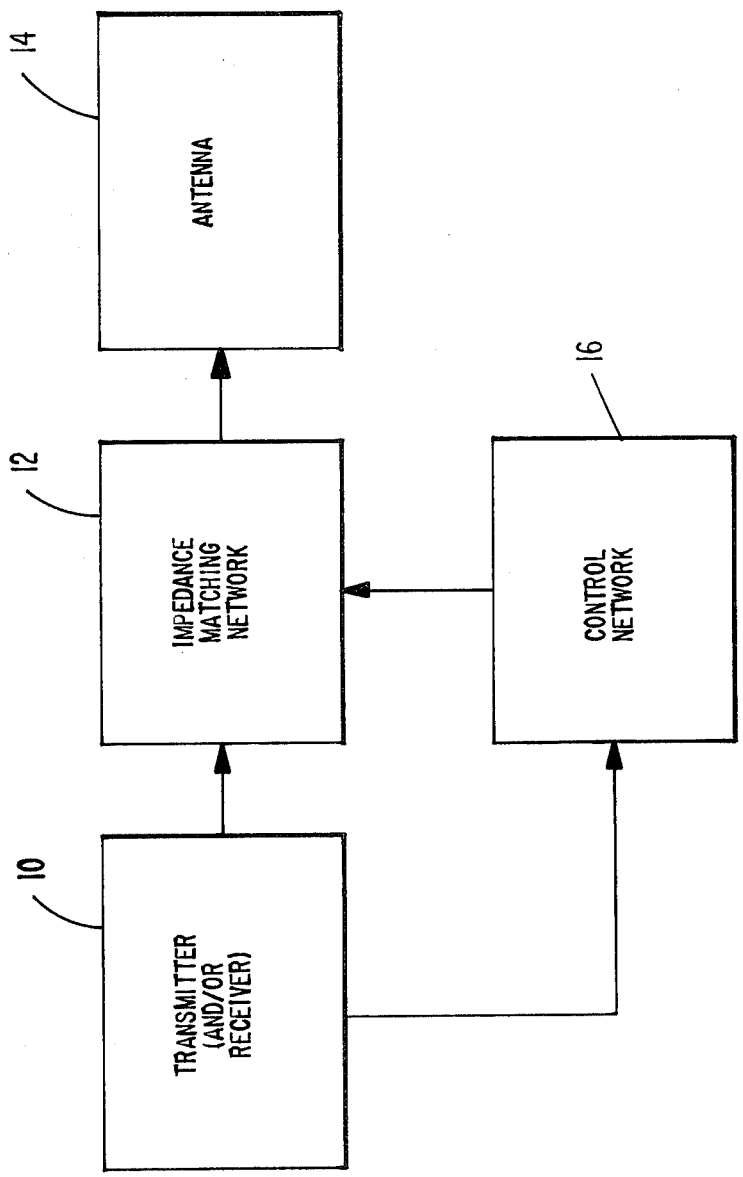

United States Patent [19]
Anderson

[11] Patent Number: 4,477,817
[45] Date of Patent: Oct. 16, 1984

[54] SWITCHING CIRCUIT INCLUDING PIN DIODES FOR IMPEDANCE MATCHING

[75] Inventor: Wendell G. Anderson, Moorestown, N.J.

[73] Assignee: RCA Corporation, New York, N.Y.

[21] Appl. No.: 396,280

[22] Filed: Jul. 8, 1982

[51] Int. Cl.³ .............................................. H01Q 1/50
[52] U.S. Cl. .................................. 343/861; 333/17 M
[58] Field of Search ............... 343/861, 745; 455/120, 455/121, 122, 123, 125, 129; 307/311, 259; 324/96; 333/17 M

[56] References Cited

U.S. PATENT DOCUMENTS

| | | | |
|---|---|---|---|
| 1,945,735 | 2/1934 | Davis | 250/33 |
| 2,068,990 | 1/1937 | Kolster et al. | 455/121 |
| 2,074,896 | 3/1937 | Earnshaw | 343/861 |
| 2,102,410 | 12/1937 | Fyler | 343/894 |
| 2,438,116 | 3/1948 | Dodds et al. | 455/121 |
| 2,493,746 | 1/1950 | Bowden | 171/242 |
| 3,179,941 | 4/1965 | Harris | 343/723 |
| 3,454,791 | 7/1969 | Mergner | 307/259 |
| 3,475,700 | 10/1969 | Ertel | 307/259 |
| 3,522,609 | 8/1970 | Ellis | 343/703 |
| 3,732,425 | 5/1973 | Ellert et al. | 324/96 |
| 3,852,759 | 12/1974 | Felsenheld | 343/729 |
| 3,864,527 | 2/1975 | Topping | 307/259 |
| 4,296,414 | 10/1981 | Beyer | 343/5 SW |
| 4,303,831 | 12/1981 | Hamamsy | 307/311 |
| 4,359,740 | 11/1982 | Frazita | 343/703 |

Primary Examiner—Eli Lieberman
Assistant Examiner—K. Ohralik
Attorney, Agent, or Firm—Joseph S. Tripoli; George J. Seligsohn

[57] ABSTRACT

An impedance matching network suitable for tuning an antenna includes a plurality of reactive elements and control circuits for selectively switching these elements into and out of the circuit. Each control circuit includes a pair of oppositely poled, normally reverse biased, PIN diodes connected in series across a reactive element and apparatus including a selectively controllable radiation responsive element for forward biasing the PIN diodes to thereby effectively switch a reactive element out of the network. In one arrangement, the reactive elements are formed from spaced, helically wound sections of a hollow conductive tube with the biasing voltages for the PIN diodes carried by conductors located within the tube.

6 Claims, 2 Drawing Figures

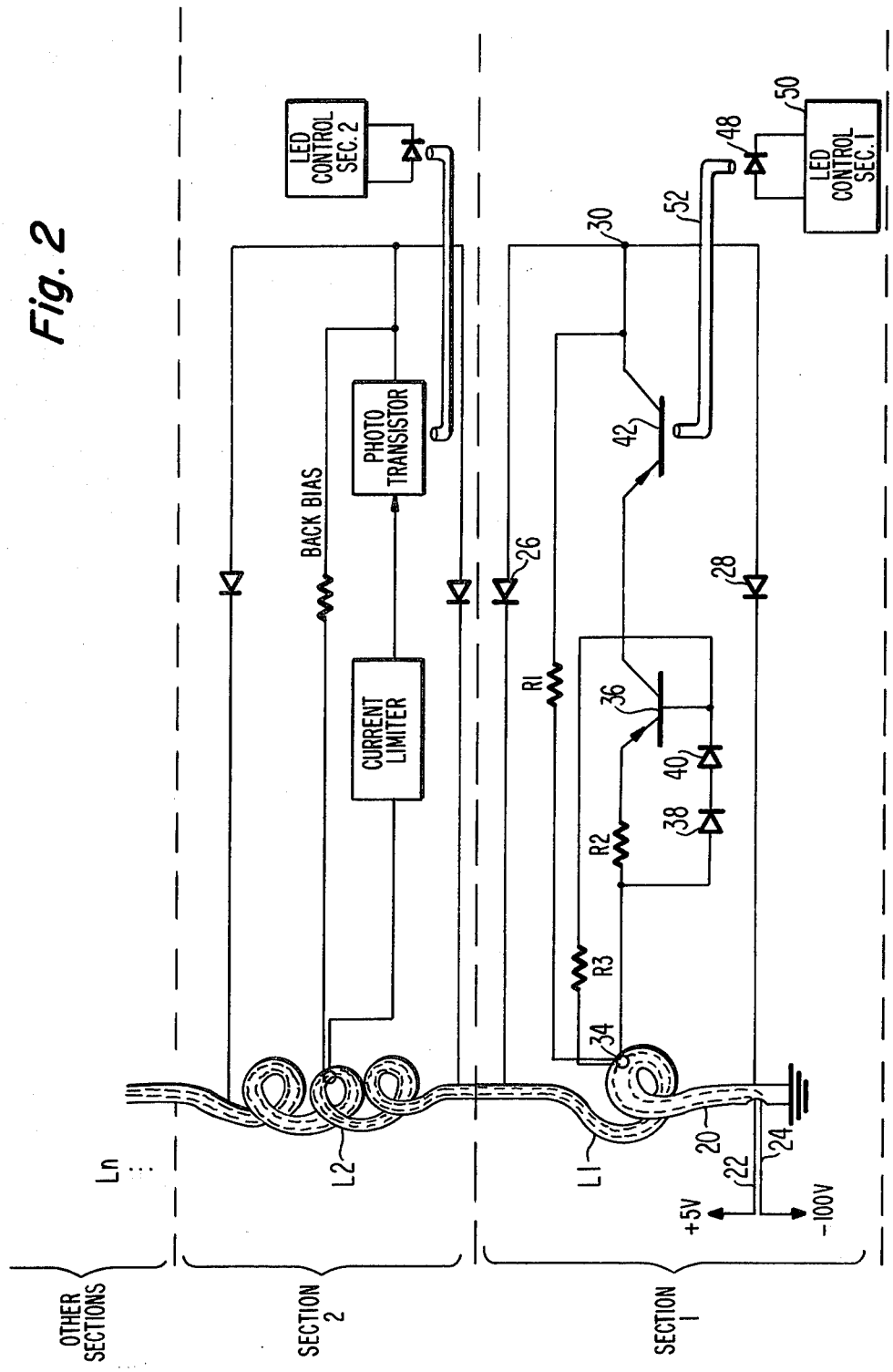

SWITCHING CIRCUIT INCLUDING PIN DIODES FOR IMPEDANCE MATCHING

The present invention relates generally to a switching circuit and more particularly to one utilizing PIN diodes for switching a reactance into and out of an antenna tuning circuit.

In radio communications, especially at frequencies in the HF band (3-30 MHZ) and below, it is known that there are many applications where the effective antenna length is not properly matched to the transmitter or receiver either at the operating frequency or across the full band of possible operating frequencies. Very often this is a result of the fact that the physical size of the antenna is fixed and the operating band width is relatively large. In other instances, such as in the case of shipborne or airborne communications systems, there simply is not enough physical space to provide an antenna of the proper length to give optimum performance at the operating frequency. In such instances it is desirable to employ some means to adjust the effective electrical length of the antenna to make it more efficient at any frequencies in the band of interest.

Since each transmitter or receiver in the applications under consideration is usually associated with only one antenna, which is of fixed length, the adjustment of the effective length of the antenna must be made by electrical means. This is the process which is sometimes termed antenna tuning and is accomplished by adding either inductance or capacitance to the antenna at the point where it is fed from the transmitter (or receiver) or along the transmission line feeding the antenna. Adding inductance increases the effective electrical length while adding capacitance decreases the effective electrical length of the antenna.

Typically, this effective length adjustment takes the form of a matching network placed between the transmitter (or receiver) and the antenna. A matching network may take the form of a $\pi$ or an L circuit section where inductance or capacitance can be switched into or out of the network as desired.

A matching network may be considered an impedance transformer whose function is to maintain the proper impedance transformation ratio between a constant transmitter or receiver impedance of, for example, 50 ohms and the antenna. Changes in frequency cause changes in the operating wavelength which affects the impedance transformation ratio as well as the antenna impedance which also changes with frequency. In addition, the matching network is typically designed to make the impedance at the transmitter or receiver have a zero reactive component at the desired operating frequency.

The matching network may be mechanically tuned. That is, relays or other mechanical or electro-mechanical devices responsive to changes in the operating frequency may be used to switch reactive elements into or out of the network. Where faster operating speeds are desired and where there is concern about reliable performance, solid state electrical switching devices, such as PIN diodes, may be substituted for electro-mechanical devices.

PIN diodes are semiconductor devices which can be made to operate at relatively high radio frequencies (RF) and which function essentially as switched resistors, having a high or low resistance value depending upon the value of the biasing voltages. These devices typically require a relatively large reverse bias voltage to present a high impedance value and draw a substantial forward current when forward biased to present a low impedance value.

When PIN diodes are employed as switching devices for applications such as those under consideration, their control can introduce problems. Care must be taken to avoid interaction between the RF signals being switched and the relatively high reverse bias voltage or large forward bias currents supplied to the diodes, and between the RF signals and the control signal which is employed to select the bias (forward or reverse) to be applied to the PIN diodes.

The present invention is directed to an arrangement wherein relatively low level control signals are used to selectively apply the appropriate biasing for a PIN diode switching system in a manner such that the control signals are substantially unaffected by the RF transmitter (or received) signal.

In a system embodying the present invention, an element is switched into and out of a circuit by first and second oppositely poled PIN diodes connected in series across the element. A means is provided for coupling a first voltage level to a junction point between the diodes and this voltage level has a value and polarity to cause each of the diodes to assume the same one of its high or low impedance states. Another means which includes a radiation sensitive device is provided for coupling to the junction point a second voltage level at a value and polarity to cause each of the the diodes to assume the other of its impedance states upon the activation of the radiation sensitive device. A means is provided for selectively applying radiation to the radiation sensitive device for activating the same.

In another aspect of the present invention the element is a reactive element which is part of an impedance matching network and is formed from helically wound turns of a hollow conductive tube.

In yet another aspect of the present invention, a power supply means provides first and second insulated conductors respectively held at the first and second D.C. levels. These insulated conductors are passed through the hollow of the conductive tube and the tube has openings to provide access to the D.C. voltage on the first and second insulated conductors.

In the drawing:

FIG. 1 is a block diagram of a known system which can advantageously use the present invention; and FIG. 2 is a partial schematic and partial block diagram illustrating a preferred embodiment of the present invention.

Referring now to FIG. 1, a transmitter (or receiver) 10 is coupled to an antenna 14 via an impedance matching network 12. The system may be, for example, an HF radio communications system operating in the 3-30 MHZ band of frequencies. As previously indicated, the impedance matching network 12 can take the form of a $\pi$ or L type network comprising reactive elements which can be switched into and out of the network to provide the desired or optimum impedance matching across the HF band between the transmitter 10 and the antenna 14.

Also shown in FIG. 1 is a control network 16 connected between the transmitter (or receiver) 10 and the impedance matching network 12. The control network 16 is responsive to the selected operating frequency of the transmitter 10 to cause a change in the impedance matching network 12. For example, in the prior art, the transmitter frequency tuner can be mechanically ganged to the control network 16 to switch an inductor or capacitor into or out of the impedance matching network 12. In other prior art arrangements, the control network takes the form of a series of relays which respond to various operating frequency sub-bands to switch the reactive elements of the network 12.

FIG. 2 shows the preferred embodiment of the present invention. The reactive elements which can be switched into and out of an impedance matching network, such as network 12, to tune an antenna, such as 14, are shown, by way of illustration, to be formed from spaced, helically wound sections L1, L2, . . . Ln of a hollow conductive tube 20. In this case the reactive elements are inductors having inductance values which depend upon a number of parameters including the number of turns in a given helically wound section. The inductors L1, L2, . . . Ln may have equal or unequal values of inductance depending upo the particular design implementation.

The hollow conductive tube 20 is held at D.C. ground potential. In addition, insulated conductors 22 and 24 are passed through the hollow of tube 20. Conductor 22 is connected to a supply source, for example, plus 5 volts D.C., and conductor 24 is connected to another supply source, for example, minus 100 volts D.C. Thus, two bus wires 22 and 24 run inside of the hollow conductive tube 20.

The embodiment of the present invention can be viewed as comprising a plurality of sections such as section 1, section 2 and up to section N. Each one of the circuit sections is operated to switch a corresponding inductance L1, L2, . . . Ln into or out of an impedance matching network. Any combination of inductances may be switched as will become evident from the description to follow.

Looking first at circuit section 1, first and second PIN diodes 26 and 28 are connected in series and oppositely poled across the inductance L1 formed from the helical hollow tube 20. These diodes are connected in a low inductance manner by keeping the leads as short as possible. The cathode electrodes of PIN diodes 26 and 28 are connected directly to the D.C. ground on the outside of tube 20. The anode electrodes of PIN diodes 26 and 28 are connected to a common junction 30.

Hollow tube 20 has a plurality of openings such as 34. These openings provide access to the D.C. supply voltages carried by the insulated conductors passing through the tube 20. The positive and negative power supply leads should go through the same opening, such as 34, for a given section, such as section 1. This avoids an RF potential difference being formed across the control circuit. In addition, the opening, such as 34, is arranged at the midpoint between the pin diode taps. By so doing, a balanced bridge circuit is created. In some applications it may be desired to provide some form of connector or other access device at openings such as 34.

The −100 volt D.C. supply is coupled to the common junction 30 via resistor R1 which has a value of 100 K ohms. This coupled voltage provides the reverse bias for PIN diodes 26 and 28. Thus, the inductance L1 is in the impedance matching network since a very large resistance is in parallel with L1 when diodes 26 and 28 are reverse biased.

The +5 volt supply, accessible at opening 34 is also coupled to junction 30 via a current limiting stage and a photo transistor switching stage. The current limiting stage comprises PNP transistor 36 which has its emitter electrode connected to the +5 volt supply via resistor R2 which has a value of 1.1 ohms. In addition, this supply voltage is coupled to the base electrode of transistor 36 via two diodes 38 and 40. Typically, these diodes are forward biased and have a 0.7 volt drop across each one so that the base electrode of transistor 36 is biased at about 3.6 volts D.C. The base electrode of transistor 36 is also connected back to the D.C. ground on the outside of tube 20 via resistor R3 which has a value of 36 ohms. The collector electrode of transistor 36 is the current limiter output terminal and is directly connected to the emitter electrode of the photo transistor 42.

Transistor 42 is a light sensitive or light responsive device. In the absence of light energy being applied to its light sensitive surface, transistor 42 looks like a large resistance and blocks the application of a forward bias voltage, available at the collector electrode of transistor 36, to PIN diodes 26 and 28.

Each circuit section has associated therewith a light source, such as light emitting diode 48 in section 1, and a light source control, such as 50. Control 50 is typically a low voltage circuit which is located in a control network, such as network 16, and responds to changes in the system operating frequency to either forward bias the LED 48 to generate light energy or reverse bias the LED to remove the generated light energy. Fiber optic device 52 is used to form the light path coupling LED 48 to the light sensitive transistor 42.

Circuit section 1 operates as follows. Initially the large negative supply voltage is applied to junction 30 via resistor R1 to reverse bias PIN diodes 26 and 28 so that a very high impedance is connected across the inductance L1 and therefore L1 remains in the impedance matching network. When some system change occurs, such as a frequency change to a new value, fx, the LED control section 50, which contains a frequency responsive circuit, responds to the change in frequency to fx by applying a forward bias to LED 48. Fiber optic 52 couples the light energy from LED 48 to the light sensitive surface of transistor 42. This turns transistor 42 on and a forward bias voltage is applied to the PIN diodes 26 and 28. The current limiting transistor 36 is effective to limit the forward current through PIN diodes 26 and 28 to a desired value. With PIN diodes 26 and 28 forward biased, they operate as a very low impedance connected in parallel with inductance L1, and this inductance is effectively switched out of the impedance matching network.

The other circuit sections operate in a similar fashion. Thus it can be seen that by appropriate control over the LED control sections it is possible to switch any combination of inductances into and out of the impedance matching network to provide for the desired antenna tuning.

Control over the switching of the PIN diodes by virtue of the light energy control as described is especially desirable since this form of control is unaffected by the main RF carrier of the system. This tends to avoid the inadvertent switching of reactive elements in and out of the impedance matching network. In addition, bringing up the power supply bus lines through the hollow tube forming the reactance elements avoids the necessity of providing separate power supply wiring to each of the switching circuit sections.

What is claimed is:

1. In a system for matching the impedance of an antenna to the impedance presented by one of a transmitter or a receiver, said system including a variable impedance matching network coupling said transmitter or receiver to said antenna, said network having a plurality of reactive elements adapted to be switched into or out of said network, the apparatus comprising:
- a hollow conductive tube having a plurality of spaced, helically wound sections, each wound section corresponding to one of said reactive elements of said plurality, said tube having a plurality of openings therein;
- a voltage supply means for providing first and second D.C. voltage levels on first and second insulated conductors, said first and second conductors being located within said conductive tube and being accessible through said openings in said tube;
- each one of said plurality of wound sections having associated therewith a corresponding switching circuit, each switching circuit comprising:
    - a pair of PIN diodes connected in series and oppositely poled across the corresponding wound section;
    - a first biasing means for coupling one said D.C. voltage levels from within said tube through an opening to the junction between the series connected PIN diodes for reverse biasing said PIN diodes and thereby placing a relatively large impedance across said corresponding wound section;
    - a second biasing means for selectively coupling the other of said D.C. voltage levels from within said tube through an opening to said junction between the series connected diodes for selectively forward biasing said PIN diodes thereby selectively placing a relatively low impendece across said corresponding wound section;
    - said second biasing means including a light responsive element whereby said second biasing means couples said other D.C. voltage level upon the application of light energy to said light responsive element;
- means for selectively generating light energy; and
- means for coupling said selectively generated light energy to individual ones of said light responsive elements in said plurality of switching circuits for selectively switching individual ones of said plurality of reactive elements corresponding to said wound sections into and out of said impedance matching network.

2. In a system for matching the impedance of an antenna to the impedance presented by one of a transmitter or receiver, in response to changes in the operating frequency of RF signals within a given frequency range, said system including a variable impedance matching network coupling said transmitter or receiver to said antenna, said network having a plurality of reactive elements adapted to be switched into or out of said network in response to said changes of frequency, the apparatus comprising:
- a voltage supply means for providing first and second D.C. voltage levels;
- each one of said plurality of reactive elements having associated therewith a corresponding switching circuit, each switching circuit comprising:
    - first and second oppositely poled PIN diodes connected in series across the corresponding reactive element;
    - first means for coupling to a junction point between said diodes said first D.C. voltage level having a value and polarity to cause each of said diodes to assume the same one of its high and low impedance states;
    - second means for coupling to said junction point said second voltage level having a value and polarity to cause each of said diodes to assume the other of its impedance states, said second means including a light radiation responsive element, said light radiation responsive element coupling said second voltage level to said junction point in response to activation of said light radiation responsive element; and
    - third means for selectively applying or removing light radiation to or from said light radiation responsive element for activating or deactivating the same to effectively insert or remove the corresponding reactive element from said matching network in response to said changes in the operating frequency of the RF signals.

3. The system according to claim 2 further comprising a conductive hollow tubing having a plurality of spaced helically wound sections, each spaced helically wound section corresponding to an inductive reactive element in said plurality of reactive elements.

4. The system according to claim 3 wherein said voltage supply means includes first and second insulated conductors respectively, carrying said first and second voltage levels, said first and second insulated conductors being located within said conductive tube, said tube having openings to provide access to said insulated conductors.

5. The system according to claim 4 wherein said second means comprises a current limiting stage connected to said light radiation responsive element for supplying said second voltage level, and, wherein said light radiation responsive element comprises a light sensitive transistor having a main current path connected between said current limiting stage and said junction point.

6. The system according to claim 5 wherein said third means comprises a controllable light emitting diode and a fiber optic light conductor for selectively applying light energy from said light emitting diode to said light sensitive transistor.

* * * * *